United States Patent
Kusakabe et al.

(10) Patent No.: US 12,412,728 B2
(45) Date of Patent: Sep. 9, 2025

(54) ELECTRON BEAM INSPECTION SYSTEM

(71) Applicant: JEOL Ltd., Tokyo (JP)

(72) Inventors: Ryuichi Kusakabe, Tokyo (JP); Noriyuki Kobayashi, Tokyo (JP)

(73) Assignee: JEOL Ltd., Tokyo (JP)

( * ) Notice: Subject to any disclaimer, the term of this patent is extended or adjusted under 35 U.S.C. 154(b) by 388 days.

(21) Appl. No.: 17/844,120

(22) Filed: Jun. 20, 2022

(65) Prior Publication Data

US 2022/0406560 A1 Dec. 22, 2022

(30) Foreign Application Priority Data

Jun. 21, 2021 (JP) ................. 2021-102160

(51) Int. Cl.
*H01J 37/20* (2006.01)

(52) U.S. Cl.
CPC ..... *H01J 37/20* (2013.01); *H01J 2237/20278* (2013.01)

(58) Field of Classification Search
None
See application file for complete search history.

(56) References Cited

U.S. PATENT DOCUMENTS

| | | | | |
|---|---|---|---|---|
| 2002/0030170 | A1* | 3/2002 | McKell | F15B 9/09 251/129.04 |
| 2004/0145119 | A1* | 7/2004 | Nakamura | F16C 29/025 277/409 |
| 2008/0302427 | A1* | 12/2008 | Watanabe | F16K 31/0613 137/488 |
| 2011/0204255 | A1* | 8/2011 | Ooae | G03F 7/70716 250/453.11 |

FOREIGN PATENT DOCUMENTS

| | | | | |
|---|---|---|---|---|
| CN | 106383497 A | * | 2/2017 | ......... G05B 19/4147 |
| DE | 112013003328 B4 | * | 2/2020 | ............... H01J 37/20 |
| EP | 3220221 A1 | * | 9/2017 | ......... G05B 23/0256 |
| JP | H06204107 A | * | 7/1994 | |
| JP | H1193911 A | * | 4/1999 | |

(Continued)

OTHER PUBLICATIONS

English machine translation for JP-H11183672-A (Year: 1999).*
English machine translation for JP-H06204107-A (Year: 1994).*
English machine translation for JP-H1193911-A (Year: 1999).*

(Continued)

*Primary Examiner* — Robert H Kim
*Assistant Examiner* — Alina Kaliszewski
(74) *Attorney, Agent, or Firm* — The Webb Law Firm

(57) ABSTRACT

There is provided an electron beam inspection system which can enhance the safety of the whole system if servo valves are deactivated in the event of a power failure or an emergency stop. The electron beam inspection system has a beam source, a stage mechanism, and a pump. The stage mechanism has a guide shaft, a slider, a first servo valve, a second servo valve, a first exhaust pipe, a second exhaust pipe, and an exhaust valve. The slider is movably supported to the guide shaft via a hydrostatic bearing and has a first pressure subchamber and a second pressure subchamber. The exhaust valve is mounted in the first exhaust pipe. When the servo valves are in operation, the exhaust valve is opened. When supply of electric power to the servo valves is ceased, the exhaust valve is closed.

4 Claims, 7 Drawing Sheets

(56) References Cited

FOREIGN PATENT DOCUMENTS

| JP | H11183672 A | * | 7/1999 | |
|---|---|---|---|---|
| JP | H11190306 A | | 7/1999 | |
| JP | 2007101444 A | * | 4/2007 | |
| WO | WO-2004032212 A1 | * | 4/2004 | ............. B82Y 10/00 |

OTHER PUBLICATIONS

English machine translation for WO-2004032212-A1 (Year: 2004).*
English machine translation for JP-2007101444-A (Year: 2007).*
English machine translation for CN-106383497-A (Year: 2017).*
English machine translation for DE-112013003328-B4 (Year: 2020).*

* cited by examiner

ELECTRON BEAM INSPECTION SYSTEM

CROSS-REFERENCE TO RELATED APPLICATION

This application claims priority to Japanese Patent Application No. 2021-102160 filed Jun. 21, 2021, the disclosure of which is hereby incorporated by reference in its entirety.

BACKGROUND OF THE INVENTION

1. Field of the Invention

The present invention relates to an electron beam inspection system.

2. Description of the Related Art

An electron beam inspection system has a stage apparatus by which a sample is movably supported. To permit the sample to be accurately irradiated with an electron beam, the stage apparatus is required to move at improved accuracy. In recent years, in order to improve the accuracy of movement of such stage apparatus, it is considered to use a stage apparatus that employs a hydrostatic fluid bearing. In this fluid bearing, there is a gap between a guide shaft and a movable body. A fluid membrane is created in this gap by a lubricating fluid. The movable body is floated a distance equal to the thicknesswise dimension of the fluid membrane away from the guide shaft, thus accomplishing smooth movement of the movable body. JP A 11 190306 sets forth a technique regarding an air stage assembly which uses a gas as a lubricating fluid. Furthermore, in JP A 11 190306, there is described a technique of causing a thrust to act on a sliding table by supporting the sliding table to a horizontal securing member via a hydrostatic fluid bearing in a non-contact manner, controlling the air pressures in two air pressure chambers formed between the securing member and the sliding table by means of an air pressure control system, and utilizing the difference between the air pressures.

However, in the technique set forth in JP A 11 190306, when servo valves for supplying air into the pressure chambers deactivate in the event of a power failure or an emergency stop, there arises the problem that the position of a slider for moving the stage cannot be controlled. Therefore, where the technique set forth in JP A 11 190306 is applied to an electron beam inspection system, if the servo valves deactivate, the slider may move into a position defeating the user's intention and the sample placed on the stage may come into contact with other device, thus damaging the sample or other device.

SUMMARY OF THE INVENTION

In view of the foregoing problem, it is an object of the present invention to provide an electron beam inspection system which as a whole provides improved safety if the servo valves deactivate in the event of a power failure or an emergency stop.

In order to solve the above problem and to achieve the object of the present invention, an electron beam inspection system is provided which comprises: an electron beam source for emitting an electron beam; a stage mechanism for providing movable support of a sample irradiated with the electron beam; and a pump for supplying air to the stage mechanism. The stage mechanism has a guide shaft, a slider, a first servo valve, a second servo valve, a first exhaust pipe, a second exhaust pipe, and an exhaust valve. The slider is movably supported to the guide shaft via a hydrostatic bearing and has a first and a second pressure subchambers. The first servo valve controls the pressure in the first pressure subchamber. Similarly, the second servo valve controls the pressure in the second pressure subchamber. Air discharged from the first servo valve passes through the first exhaust pipe. Air discharged from the second servo valve passes through the second exhaust pipe. The exhaust valve is mounted in the first exhaust pipe. When the first and second servo valves are in operation, the exhaust valve is opened. When power supply to these two servo valves is cut off, the exhaust valve is closed.

An electron beam inspection system of the present invention has the advantage that the safety of the whole system can be enhanced if the servo valves deactivate in the event of a power failure or an emergency stop.

DESCRIPTION OF THE INVENTION

Figure 1:
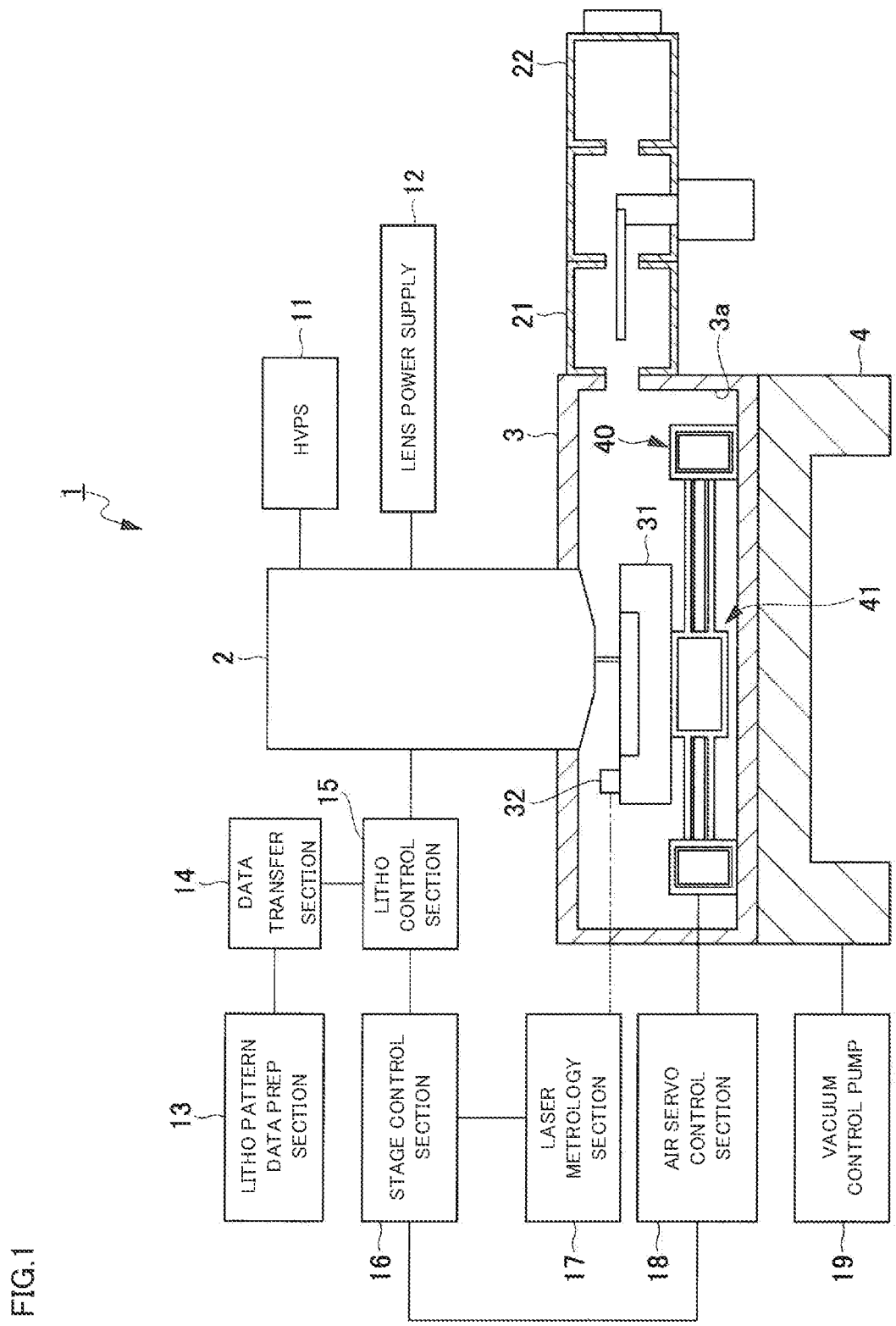
FIG. 1 is a schematic block diagram of an electron beam inspection system associated with one embodiment of the present invention.

Embodiments of the electron beam inspection system of the present invention are hereinafter described with reference to FIGS. 1-8, in which identical members are designated by identical reference numerals.

1. Embodiment

1-1. Configuration of Electron Beam Inspection System

An electron beam inspection system associated with one embodiment of the present invention is first described by referring to FIG. 1, which schematically illustrates the system of this embodiment.

The electron beam inspection system shown in FIG. 1 is generally indicated by reference numeral 1 and operates to irradiate a sample with an electron beam and to inspect a pattern on the sample. As shown, the inspection system 1 has an electron beam source 2 for generating the electron beam, a vacuum chamber 3, and a vibration isolated table 4. The vacuum chamber 3 has an interior 3a in which there are arranged a chuck 31 for holding the sample and a stage apparatus 40. The sample held by the chuck 31 is movably supported by the stage apparatus 40 whose configuration will be described in detail later. A sample exchange chamber 22 for exchanging the sample and a mask adjustment chamber 21 for adjusting the position of a mask are in communication with the interior 3a of the vacuum chamber 3.

The electron beam source 2 further includes an electron gun for emitting an electron beam and an optics unit that includes an objective lens and condenser lenses. A high-voltage power supply (HVPS) 11 for supplying electric power to the electron gun and a lens power supply 12 for supplying electric power to the optics unit are connected to the electron beam source 2.

Furthermore, the electron beam inspection system 1 includes a lithography (litho) pattern data preparation (prep) section 13, a data transfer section 14, a lithography (litho) control section 15, a stage control section 16, a laser metrology section 17, an air servo control section 18, and a pump 19 for providing vacuum control.

The lithography pattern preparation section 13 creates lithography pattern data about a lithography pattern to be drawn on a sample and outputs the created pattern data to the lithography control section 15 via the data transfer section 14. The lithography control section 15 is connected to the beam source 2 and to the stage control section 16. The lithography control section 15 controls the beam source 2 and the stage control section 16 based on the lithography pattern data acquired from the data transfer section 14. Regarding the beam source 2, the lithography control section 15 controls the beam impact point, the timing of irradiation, the electron beam system, and others.

The stage control section 16 is connected to the laser metrology section 17 and to the air servo control section 18. The laser metrology section 17 emits a laser beam at a mirror 32 mounted on the chuck 31 and receives laser light reflected from the mirror 32. Then, the laser metrology section 17 measures the positions of the chuck 31 and sample supported on the stage apparatus 40, and outputs positional information to the stage control section 16.

Based on the positional information from the laser metrology section 17 and on the control signal from the lithography control section 15, the stage control section 16 outputs a stage apparatus control signal to the air servo control section 18, thus controlling the actuation of the stage apparatus 40. The air servo control section 18 is connected to the stage apparatus 40 and controls the actuation of servo valves 51, 52 (described later in connection with FIG. 3) of the stage apparatus 40.

The pump 19 is connected to the vacuum chamber 3 and to the stage apparatus 40 and operates to suck in air from inside the vacuum chamber 3 and to supply air into the stage apparatus 40. The pump 19 is supplied with electric power from a power supply that is different from the high-voltage power supply 11 connected with the beam source 2 and also from the lens power supply 12.

Figure 2:
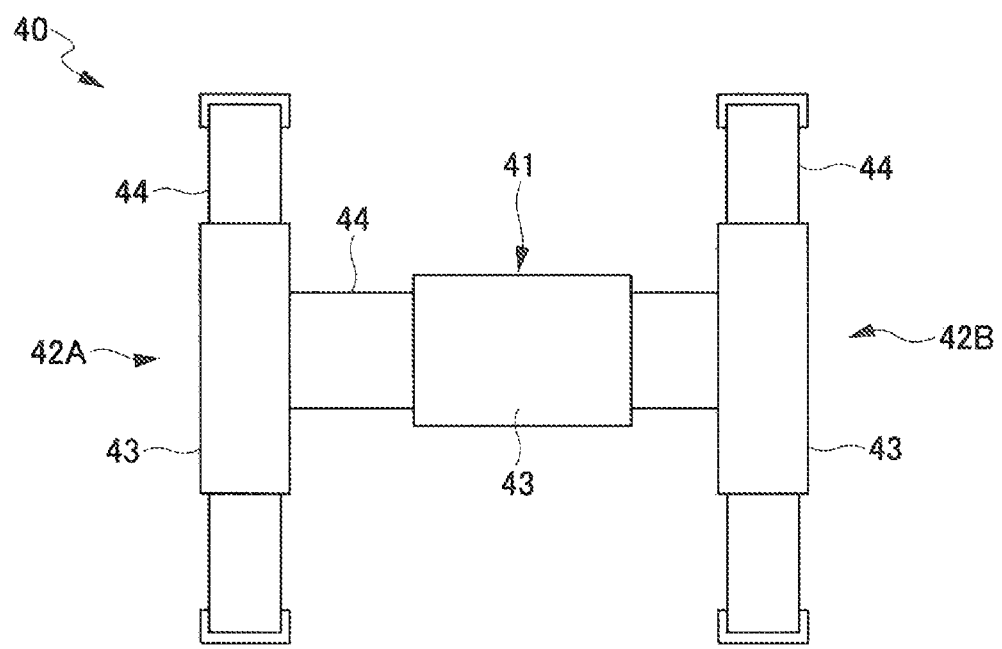
FIG. 2 is a plan view of a stage apparatus included in the electron beam inspection system of FIG. 1.

The stage apparatus 40 is next described by referring to FIG. 2, which is a plan view of the apparatus 40. This apparatus 40 has a first stage mechanism 41, a second stage mechanism 42A, and a third stage mechanism 42B each of which has a slider 43 and a guide shaft 44 by which the slider 43 is movably supported.

The guide shaft 44 of the first stage mechanism 41 is disposed parallel to a first direction X that runs parallel to a horizontal direction. The second stage mechanism 42A is located at one end of the first stage mechanism 41 as viewed in the first direction X, while the third stage mechanism 42B is located at the other end of the first stage mechanism 41 as viewed in the first direction X. The opposite ends of the guide shaft 44 of the first stage mechanism 41 are supported on their respective ones of the sliders 43 of the second stage mechanism 42A and the third stage mechanism 42B.

The guide shafts 44 of the second stage mechanism 42A and the third stage mechanism 42B lie parallel to the horizontal direction and also to a second direction Y that intersects the first direction X. Furthermore, the guide shafts 44 of the second and third stage mechanisms 42A, 42B are supported on the vibration isolated table 4 (see FIG. 1). The chuck 31 (see FIG. 1) and a sample are placed on the slider 43 of the first stage mechanism 41.

Figure 3:
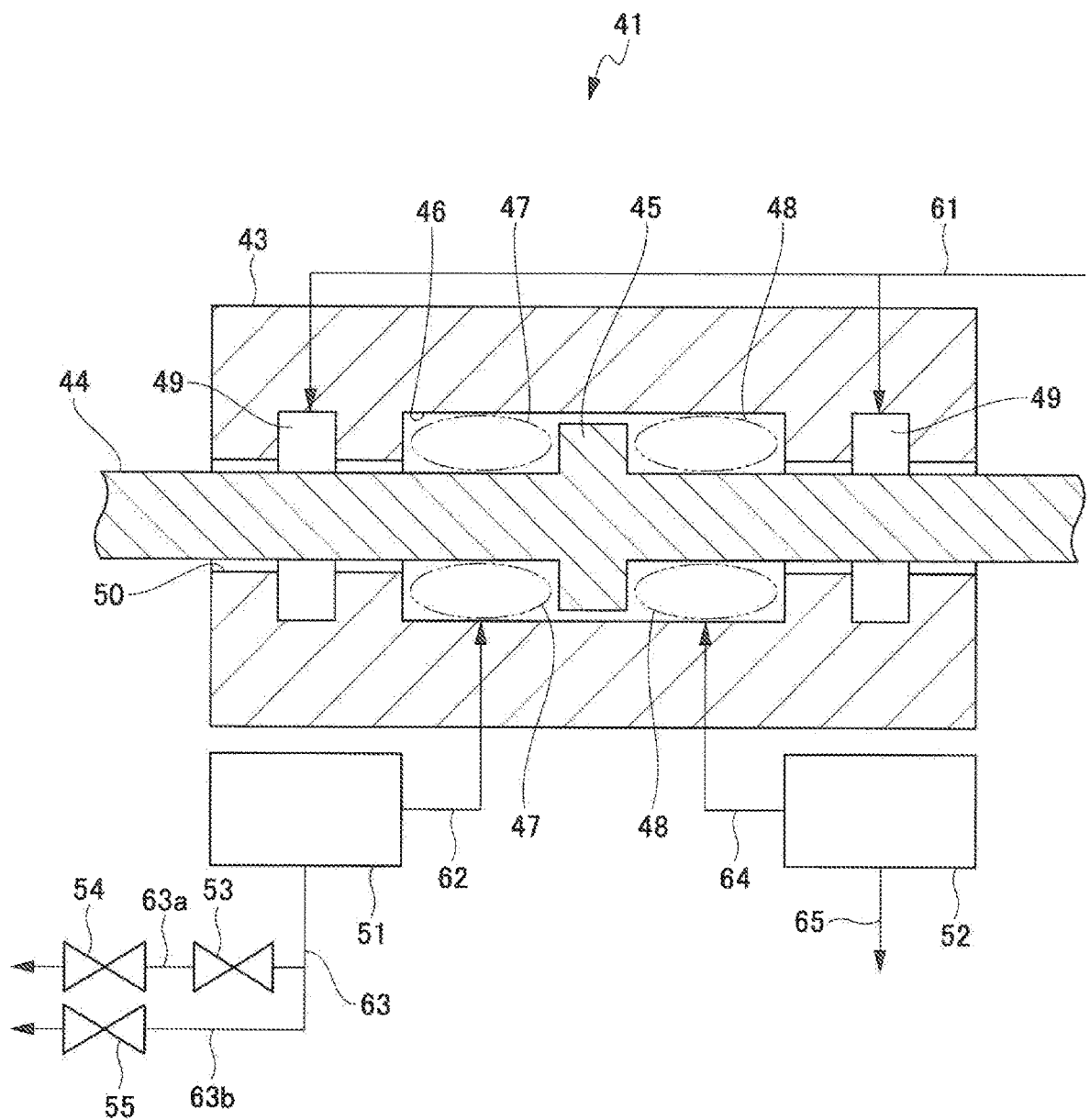
FIG. 3 is a cross-sectional view of one stage mechanism of the electron beam inspection system of FIG. 1.

Details of the configurations of the stage mechanisms 41, 42A, and 42B are next described by referring to FIG. 3. Since these stage mechanisms 41, 42A, and 42B are identical in configuration, only the first stage mechanism 41 is described herein. In the following description, the first stage mechanism 41 will be simply referred to as the stage mechanism 41. FIG. 3 is a cross-sectional view of the stage mechanism 41. As shown, the stage mechanism 41 has the slider 43, the guide shaft 44, the first servo valve 51, the second servo valve 52, a flow adjusting valve 53, a flow regulator 54, and an exhaust valve 55.

The slider 43 is hollow and rectangularly shaped. A pressure chamber 46 and through-holes 50 are formed in the slider 43. The through-holes 50 are formed at opposite ends of the slider 43 as viewed in the first direction X and in communication with the pressure chamber 46. The through-holes 50 in the second stage mechanism 42A and in the third stage mechanism 42B are formed at opposite ends of the slider 43 as viewed in the second direction Y. The guide shaft 44 extends through the through-holes 50.

Each through-hole 50 has a surface opposite to the guide shaft 44, and a groove 49 is formed in this surface. An air supply pipe 61 is connected to the groove 49. Air is always supplied into the groove 49 from the pump 19 (see FIG. 1) via the air supply pipe 61. An air film is formed between the inner surface of the through-hole 50 of the slider 43 and the outer surface of the guide shaft 44 because compressed air is supplied into the groove 49. Consequently, the slider 43 is supported out of contact with the guide shaft 44. The groove 49 defines a hydrostatic bearing.

A partition 45 is formed on the guide shaft 44, and is a flange protruding substantially at right angles from the outer surface of the guide shaft 44. The partition 45 is disposed in the pressure chamber 46 of the slider 43 and on the guide shaft 44. Therefore, the pressure chamber 46 of the slider 43 is partitioned into a first pressure subchamber 47 and a second pressure subchamber 48 by the partition 45. The pressure subchambers 47 and 48 are in communication with the grooves 49 via the through-holes 50.

In the first stage mechanism 41, the first pressure subchamber 47 is formed around one end of the partition 45 as viewed in the first direction X, and the second pressure subchamber 48 is formed around the other end of the partition 45 as viewed in the first direction X. In the second stage mechanism 42A and the third stage mechanism 42B, the first pressure subchamber 47 is formed around one end of the partition 45 as viewed in the second direction Y. The second pressure subchamber 48 is formed around the other end of the partition 45 as viewed in the second direction Y. The first pressure subchamber 47 is connected to the first servo valve 51 via a first pipe 62, while the second pressure subchamber 48 is connected to the second servo valve 52 via a second pipe 64.

The first servo valve 51 and the second servo valve 52 are connected to the pump 19 (see FIG. 1) via their respective supply tubes. The first servo valve 51 and the second servo valve 52 are connected to the air servo control section 18 and their actuation is controlled by the air servo control section 18. The first servo valve 51 controls the air pressure in the first pressure subchamber 47 by supplying and discharging air into and from the first pressure subchamber 47 in response to a control signal from the air servo control section 18. The second servo valve 52 controls the air pressure in the second pressure subchamber 48 by supplying and discharging air into and from the second pressure subchamber 48 in response to a control signal from the air servo control section 18.

The slider 43 is moved along the guide shaft 44 by creating a differential air pressure between the air pressure in the first pressure subchamber 47 and the air pressure in the second pressure subchamber 48 by the first servo valve 51 and the second servo valve 52. In particular, by making the air pressure in the first pressure subchamber 47 higher than that in the second pressure subchamber 48 by the two servo valves 51, 52, the slider 43 is moved toward one end in the first direction X (i.e., to the left as viewed in FIG. 3). By making the air pressure in the second pressure subchamber 48 higher than that in the first pressure subchamber 47 by the two servo valves 51, 52, the slider 43 is moved toward the other end as viewed in the first direction X (i.e., to the right as viewed in FIG. 3). The two servo valves 51 and 52 maintain the slider 42 at rest by making equal the air pressures in the first pressure subchamber 47 and in the second pressure subchamber 48.

If the first servo valve 51 and the second servo valve 52 are deactivated in the event of a power failure or an emergency stop, supply lines for the valves are closed off. That is, if the operation of these valves 51, 52 is deactivated, air supplied from the pump 19 is not supplied into the first pressure subchamber 47 and second pressure subchamber 48 via the first pipe 62 and second pipe 64. When the servo valves 51 and 52 are out of operation, exhaust lines connected to a first exhaust pipe 63 and a second exhaust pipe 65 (both described later herein) are opened.

The first exhaust pipe 63 and the second exhaust pipe 65 are connected to the first servo valve 51 and the second servo valve 52, respectively. The second exhaust pipe 65 for the second servo valve 52 is open at all times.

The first exhaust pipe 63 for the first servo valve 51 branches into two pipes, i.e., an exhaust pipe 63a and an adjusting pipe 63b. The flow adjusting valve 53 and the flow regulator 54 which together constitute an exhaust flow adjusting mechanism are mounted in the exhaust pipe 63a. The exhaust valve 55 is mounted in the adjusting pipe 63b.

When electric power is supplied to the exhaust valve 55, it is opened. Conversely, when the supply of electric power is cut off, the valve 55 is closed. Therefore, when the stage mechanism 41 is in normal condition, i.e., the first servo valve 51 and the second servo valve 52 are in operation, the exhaust valve 55 is opened. Air exhausted during operation of the first servo valve 51 is expelled from the exhaust valve 55. When the stage mechanism 41 is out of operation, i.e., power supply to the first servo valve 51 and the second servo valve 52 ceases, the exhaust valve 55 is closed.

When the pressure in the exhaust pipe 63a reaches a given level, the flow adjusting valve 53 and the regulator 54 are opened. Then, the adjusting valve 53 and regulator 54 adjust the flow rate and pressure of air flowing through the exhaust pipe 63a.

2. Example of Operation of Stage Mechanism

Figure 4:
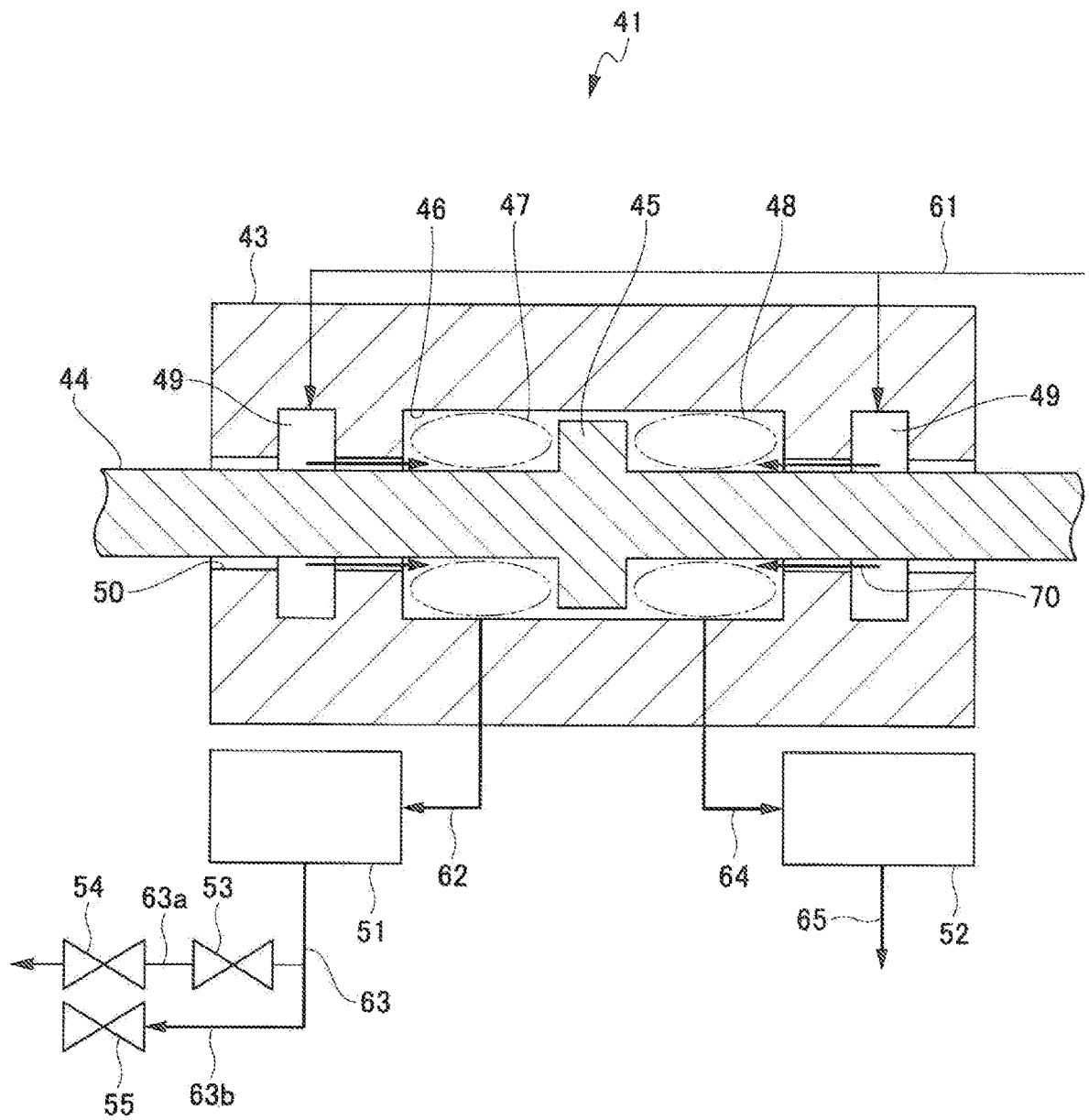
FIGS. 4 and 5 illustrate an operational state occurring when the servo valves of the stage mechanism of the electron beam inspection system of FIG. 1 are inoperative.
Figure 5:
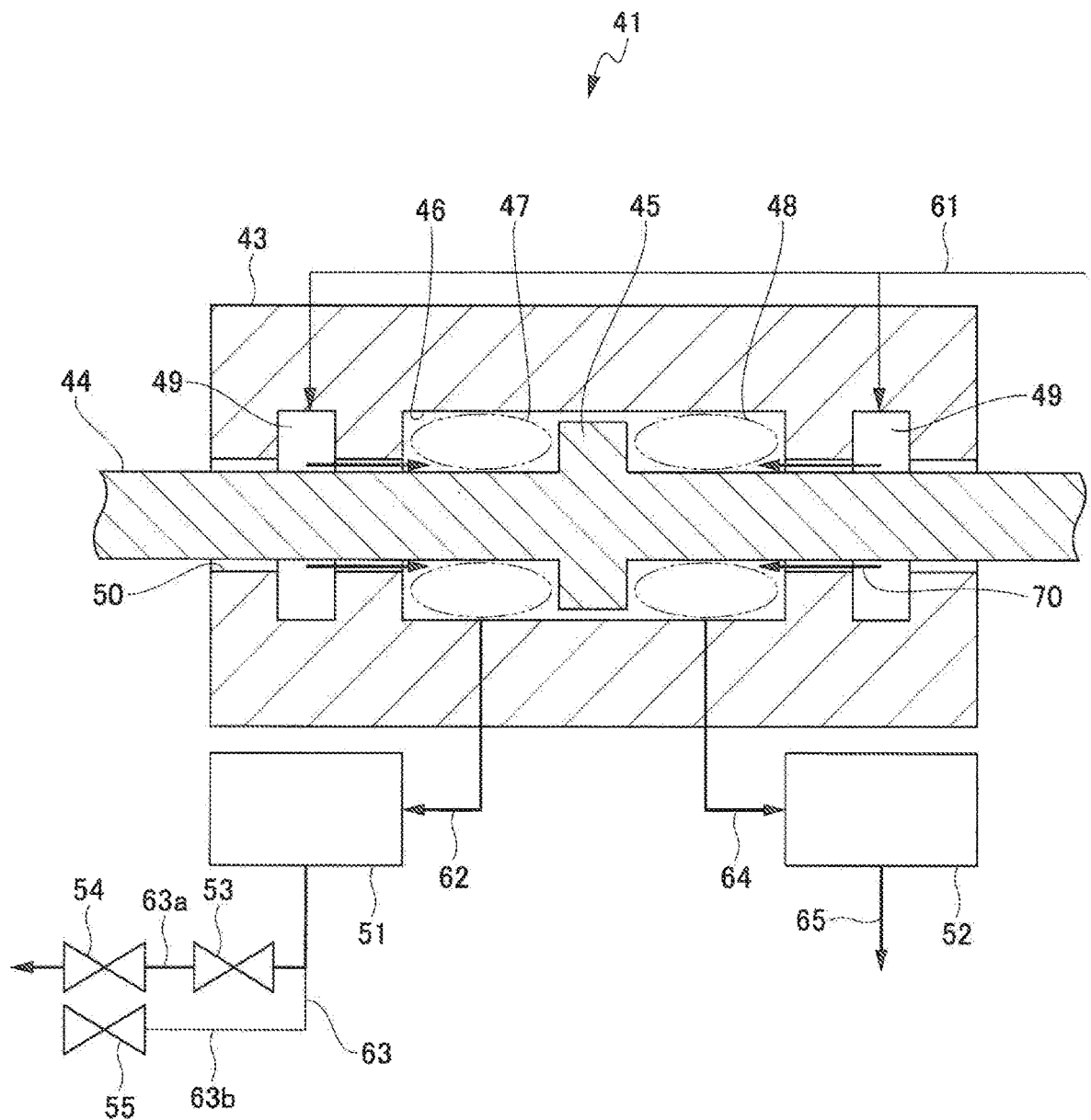
Figure 6:
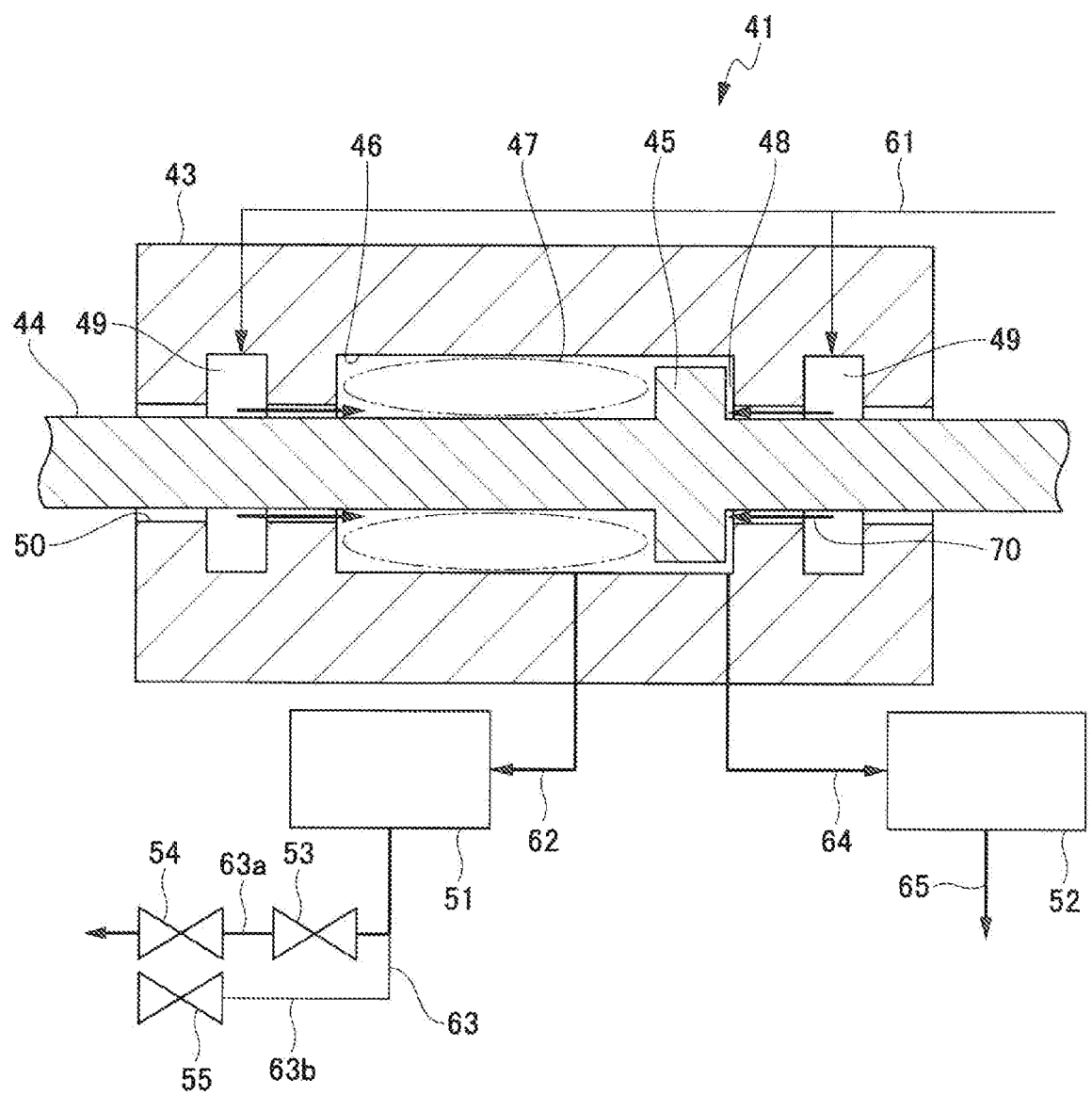
FIG. 6 illustrates an operational state in which the slider of the stage mechanism of the electron beam inspection system of FIG. 1 has been retracted into its safety position.

An example of operation of the stage mechanism 41 of the above-described configuration when it is deactivated because of a power failure or an emergency stop is next described by referring to FIGS. 4-6. FIGS. 4 and 5 illustrate an operational state in which the stage mechanism 41 is out of operation and its slider 43 has been retracted to its safety position.

Referring to FIG. 4 as well as to FIG. 1, if the electron beam inspection system 1 suffers a power failure or makes an emergency stop, the air servo control section 18 is also deactivated, and the first servo valve 51 and the second servo valve 52 of the stage mechanism 41 are deactivated. As described previously, the supply lines for the first servo valve 51 and the second servo valve 52 are cut off. This shuts off the supply of air into the first pressure subchamber 47 and the second pressure subchamber 48 from the first pipe 62 and the second pipe 64 which are connected to the first servo valve 51 and the second servo valve 52, respectively.

The pump 19 is supplied with electric power from a power supply different from all of the high-voltage power supply 11 connected with the beam source 2, the lens power supply 12, and the power supplies for electrically energizing the first servo valve 51 and the second servo valve 52. Therefore, if any other device is deactivated, the pump 19 permits supply of air into the vacuum chamber 3 and into the stage mechanism 41. In consequence, the groove 49 constituting the hydrostatic bearing of the slider 43 is supplied with air from the pump 19 via the air supply pipe 61.

The grooves 49 are in communication with the first pressure subchamber 47 and the second pressure subchamber 48, respectively, and so if the first servo valve 51 and the second servo valve 52 come out of operation, air 70 is supplied into the first pressure subchamber 47 and the second pressure subchamber 48 via the grooves 49.

If the supply of electric power to the first servo valve 51 and the second servo valve 52 ceases, their exhaust lines are opened. Therefore, the air in the first pressure subchamber 47 flows into the first exhaust pipe 63 via the first pipe 62 and the first servo valve 51. The air in the second pressure subchamber 48 flows into the second exhaust pipe 65 via the second pipe 64 and the second servo valve 52.

If the supply of electric power to the exhaust valve 55 mounted in the first exhaust pipe 63 for the first servo valve 51 is stopped, the valve 55 is closed as shown in FIG. 5. Therefore, air expelled from the first exhaust pipe 63 for the first servo valve 51 flows into the adjusting pipe 63b from the exhaust pipe 63a in which the flow adjusting valve 53 and the flow regulator 54 are mounted, whereby the flow of air through the adjusting pipe 63b is limited. The second exhaust pipe 65 for the second servo valve 52 is opened.

This creates a difference between the flow rate of air expelled from the first exhaust pipe 63 for the first servo valve 51 and the flow rate of air expelled from the second exhaust pipe 65 for the second servo valve 52. In the present example, the flow rate of air expelled from the first exhaust pipe 63 for the first servo valve 51 decreases relative to the flow rate of air expelled from the second exhaust pipe 65 for the second servo valve 52. As a result, the air pressure in the first pressure subchamber 47 connected to the first servo valve 51 becomes higher than that in the second pressure subchamber 48 connected to the second servo valve 52.

Because the first pressure subchamber 47 goes higher in inner air pressure than the second pressure subchamber 48, the slider 43 is moved toward one end as viewed in the first direction X (i.e., to the left as viewed in FIG. 6). Consequently, if the supply of electric power to the first servo valve 51 and the second servo valve 52 comes to a stop because of a power failure or an emergency stop, the slider 43 can be moved in a desired direction. Hence, the slider 43 can be retracted into a safety position. As a result, it is possible to prevent the slider 43 from moving in a manner contrary to user's intention; otherwise the slider 43 or the sample on it would touch and damage other device. Thus, the safety of the whole electron beam inspection system 1 can be enhanced.

The flow adjusting valve 53 and the flow regulator 54 for adjusting the flow rate of exhausted air are mounted in the first exhaust pipe 63 for the first servo valve 51. Therefore, it is possible to prevent the flow rate of the air discharged from the second exhaust pipe 65 for the second servo valve 52 from becoming abruptly greater than that of the air discharged from the first exhaust pipe 63 for the first servo valve 51. Consequently, the differential pressure between the first pressure subchamber 47 and the second pressure subchamber 48 can be controlled and thus the moving speed of the slider 43 can be adjusted. As a result, the moving speed of the slider 43 can be prevented from increasing rapidly; otherwise, the slider 43 would contact other devices.

Figure 7:
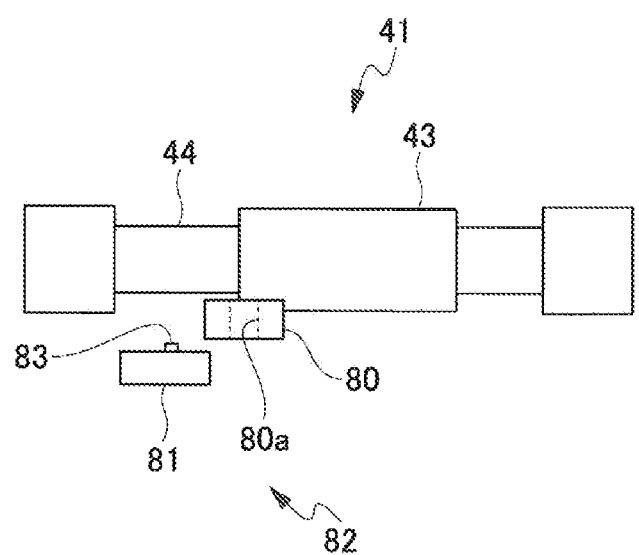
FIG. 7 is an explanatory view of a lock mechanism for the stage mechanism of the electron beam inspection system of FIG. 1.
Figure 8:
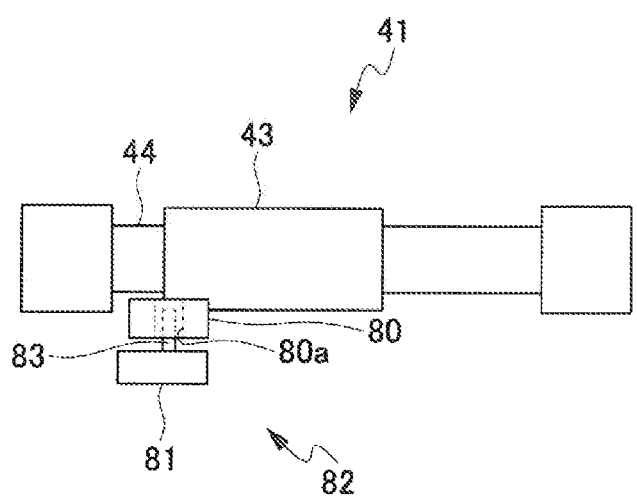
FIG. 8 is a view similar to FIG. 7, but in which the lock mechanism is operative.

FIGS. 7 and 8 illustrate a lock mechanism mounted in the stage mechanism 41. As shown in FIG. 7, the lock mechanism, 82, in the stage mechanism 41 operates to limit movement of the slider 43 when it has been retracted into its safety position (hereinafter may also be referred to as the retracted position). The lock mechanism 82 has a lock receptor 80 and a locking portion 81. The lock receptor 80 is secured to the slider 43 and provided with an engagement hole 80a.

The locking portion 81 is affixed to the vibration isolated table 4 (see FIG. 1) on which the stage mechanism 41 is placed. The locking portion 81 is mounted at the retracted position of the slider 43. An engagement pin 83 is mounted on the locking portion 81.

When the slider 43 moves into the retracted position as shown in FIG. 8, the engagement pin 83 faces the engagement hole 80a in the lock receptor 80. Since the engagement pin 83 protrudes from the locking portion 81, the engagement pin 83 comes into engagement with the engagement hole 80a. Consequently, when the slider 43 is in the retracted position, it can be locked by the lock mechanism 82.

Note that the lock mechanism 82 for locking the slider 43 is not restricted to the foregoing example. For example, the lock mechanism may be composed of a hook portion and a hook receptor that engages the hook portion mounted on one of the slider 43 and the vibration isolated table 4, the hook receptor being mounted on the other. Various other lock mechanisms may also be utilized.

It is to be understood that the present invention is not restricted to the embodiments set forth above and shown in the figures and that the invention can be implemented in variously modified forms without departing from the gist of the present invention delineated by the claims.

In the above embodiment, the slider 43 of the stage mechanism 41 moves horizontally. The stage mechanism is not restricted to this example. For example, a stage mechanism whose slider 43 moves vertically may also be used.

In the above embodiment, the present invention is described as one example of an electron beam inspection system. The invention is not restricted thereto. For example, the invention may also be applied to various other systems and apparatus including an electron beam lithography system, an electron microscope, an instrument for measuring samples using an electron beam, and an electron beam processing machine for processing samples using an electron beam.

In the present specification, the word "parallel" is used. It is to be understood that it is not intended to mean "strictly parallel" but rather means "substantially parallel" as long as the intended function can be exhibited.

What is claimed is:

1. An electron beam inspection system comprising:
an electron beam source for emitting an electron beam;
a stage mechanism for providing movable support of a sample irradiated with the electron beam; and
a pump for supplying air to the stage mechanism;
wherein said stage mechanism has a guide shaft having a partition formed on a surface thereof, a slider having a pressure chamber that is partitioned into a first pressure subchamber and a second pressure subchamber by the partition and movably supported to the guide shaft via a hydrostatic bearing, a first servo valve operative to control the pressure in the first pressure subchamber, a second servo valve operative to control the pressure in the second pressure subchamber, a first exhaust pipe through which air from the first servo valve passes, a second exhaust pipe through which air from the second servo valve passes, and an exhaust valve mounted in the first exhaust pipe;
wherein the exhaust valve is opened when the first and second servo valves are in operation and the exhaust valve is closed when supply of electric power to the first and second servo valves is cut off such that the first exhaust pipe is closed and the second exhaust pipe is open creating a higher pressure in the first pressure subchamber connected to the first servo valve than the pressure in the second pressure subchamber connected to the second servo valve, thereby causing the slider to retract into a safety position where the slider is prevented from moving in a manner contrary to a user's intention and the slider is moved relative to the partition formed on the guide shaft and partitioning the first pressure subchamber and the second pressure subchamber;
wherein the slider of the stage mechanism floats out of contact with the guide shaft even when a supply of electric power is cut off;
wherein said first exhaust pipe branches into an exhaust pipe and an adjusting pipe;
wherein said exhaust valve is mounted in the exhaust pipe; and
wherein an exhaust flow adjusting mechanism for adjusting the flow rate of air passing through the exhaust pipe is mounted in the adjusting pipe.

2. The electron beam inspection system as set forth in claim 1, wherein said hydrostatic bearing is a groove formed in a surface of said slider opposite to said guide shaft, the groove being in communication with said first and second pressure subchambers, and wherein air is supplied into the groove from said pump via an air supply pipe.

3. The electron beam inspection system as set forth in claim 1, wherein said pump is driven from a power supply different from power supplies that respectively energize said first servo valve and said second servo valve.

4. The electron beam inspection system as set forth in claim 1, wherein said stage mechanism has a lock mechanism for restricting movement of said slider when it has moved into the safety position, the lock mechanism comprising a first locking portion provided on the slider that is configured to engage with a second locking portion affixed to a table on which the stage mechanism is placed.

* * * * *